(12) United States Patent
Lin

(10) Patent No.: US 7,060,611 B1
(45) Date of Patent: Jun. 13, 2006

(54) METHOD FOR MANUFACTURING ELECTRIC DEVICE FOR SIGNAL TRANSMISSION

(75) Inventor: Kuen-Yun Lin, Niaosong Hsiang (TW)

(73) Assignee: YCL Mechanical Co., Ltd., Niaosong Hsiang (TW)

( * ) Notice: Subject to any disclaimer, the term of this patent is extended or adjusted under 35 U.S.C. 154(b) by 0 days.

(21) Appl. No.: 11/160,152

(22) Filed: Jun. 10, 2005

(51) Int. Cl.
*H01L 21/44* (2006.01)
(52) U.S. Cl. .................................... 438/660
(58) Field of Classification Search ............... 438/15, 438/22–27, 33, 42, 106–110, 118–119, 121, 438/123–127, 455, 460, 481, 660; 174/260–267; 29/842–557
See application file for complete search history.

(56) References Cited

U.S. PATENT DOCUMENTS

| | | | | |
|---|---|---|---|---|
| 5,315,280 A | * | 5/1994 | Stokes et al. | 336/192 |
| 6,110,823 A | * | 8/2000 | Eldridge et al. | 438/660 |
| 6,224,425 B1 | | 5/2001 | Shutter | 439/620 |
| 6,325,664 B1 | | 12/2001 | Someda et al. | 439/490 |
| 6,378,774 B1 | * | 4/2002 | Emori et al. | 235/492 |
| 6,699,065 B1 | | 3/2004 | Espenshade et al. | 439/490 |
| 6,764,343 B1 | | 7/2004 | Ferentz | 439/620 |
| 2002/0117330 A1 | * | 8/2002 | Eldridge et al. | 174/260 |

OTHER PUBLICATIONS

Taiwan Utility Model Publication No. 408892, Oct. 11, 2000, 9 pages.

* cited by examiner

*Primary Examiner*—Michael Lebentritt
*Assistant Examiner*—Andre' C. Stevenson
(74) *Attorney, Agent, or Firm*—Alan D. Kamrath; Nikolai & Mersereau, P.A.

(57) ABSTRACT

A method for manufacturing an electronic device for signal transmission includes winding a wire of at least one electronic element onto a winding portion of an inner terminal of a lead of a packaging casing, displacing the at least one electronic element away from the inner terminal to a side of the packaging casing that is distal to the inner terminal, immersing the winding portion of the inner terminal and the wire in a bath of molten solder, and removing the inner terminal and the wire from the bath of the molten solder so that the winding portion of the inner terminal forms a welded portion for reliably and electrically connecting the inner terminal to the wire. Preferably, electrical connection between the inner terminal and the wire is tested after the step of removing the inner terminal and the wire from the bath of the molten solder.

8 Claims, 5 Drawing Sheets

METHOD FOR MANUFACTURING ELECTRIC DEVICE FOR SIGNAL TRANSMISSION

BACKGROUND OF THE INVENTION

1. Field of the Invention

The present invention relates to a method for manufacturing an electronic device. In particular, the present invention relates to a method for manufacturing an electronic device for signal transmission.

2. Description of Related Art

A network device or signal transmission device such as a modem, telephone, hub, or adapter for local area network (LAN) comprises at least one connector for providing a complete local area network by a plurality of net lines. A conventional connector for signal transmission comprises a coupler socket with built-in transformer elements for modulating voltage level of the input impulses of the network. In a case that a plurality of identical connectors are mounted in the same network device, the transformer elements of these connectors are integrated to form a packaged transforming device to simplify the structure of the connectors. An example of such a conventional connector is disclosed in, e.g., Taiwan Utility Model Publication No. 408892.

FIG. 1 illustrates a conventional packaged transforming device comprising a packaging casing 10, a packaging cover 20, and a plurality of transformer elements 30. The packaging casing 10 includes a compartment 11, with a plurality of leads 12 mounted in two sidewalls delimiting the compartment 11. Each lead 12 includes an inner terminal 121 and an outer terminal 122. In a conventional procedure for manufacturing the transforming device, an end of a wire 31 of each transformer element 30 is manually welded onto the inner terminal 121 of an associated lead 12 by using a welding gun 90 and solder 91. When welding the transformer elements 30 onto the inner terminals 121 one by one, two adjacent inner terminals 121 are liable to be electrically connected by the solder 91. The qualified product ratio is lowered and the manufacturing procedure is time-consuming and labor-intensive, which is detrimental to mass production.

OBJECTS OF THE INVENTION

An object of the present invention is to provide a method for manufacturing an electronic device for signal transmission that can be accomplished in a shortened period of time.

Another object of the present invention is to provide a method for manufacturing an electronic device for signal transmission that is simple and that increases the qualified product ratio.

SUMMARY OF THE INVENTION

In accordance with the invention, a method for manufacturing an electronic device for signal transmission comprises winding a wire of at least one electronic element onto a winding portion of an inner terminal of a lead of a packaging casing, displacing the at least one electronic element away from the inner terminal to a side of the packaging casing that is distal to the inner terminal, immersing the winding portion of the inner terminal and the wire in a bath of molten solder, and removing the inner terminal and the wire from the bath of the molten solder so that the winding portion of the inner terminal forms a welded portion for reliably and electrically connecting the inner terminal to the wire of the at least one electronic element.

Preferably, the method further comprises a step of testing electrical connection between the inner terminal and the wire after the step of removing the inner terminal and the wire from the bath of the molten solder.

Preferably, the method further comprises a step of securely embedding and sealing the at least one electronic element by encapsulant after the step of testing electrical connection between the inner terminal and the wire.

Preferably, the electronic element is a transformer element or a filter.

Preferably, the packaging casing comprises a compartment for accommodating the at least one electronic element.

Preferably, the compartment is covered by a packaging cover.

Preferably, the packaging casing further comprises a bottom opening allowing passage of the at least one electronic element.

Preferably, the at least one lead is embedded in a sidewall of the packaging casing and comprises two exposed ends respectively forming the inner terminal and an outer terminal.

Preferably, the solder is soldering tin.

Other objects, advantages and novel features of this invention will become more apparent from the following detailed description when taken in conjunction with the accompanying drawings.

DETAILED DESCRIPTION OF THE PREFERRED EMBODIMENT

Figure 1:
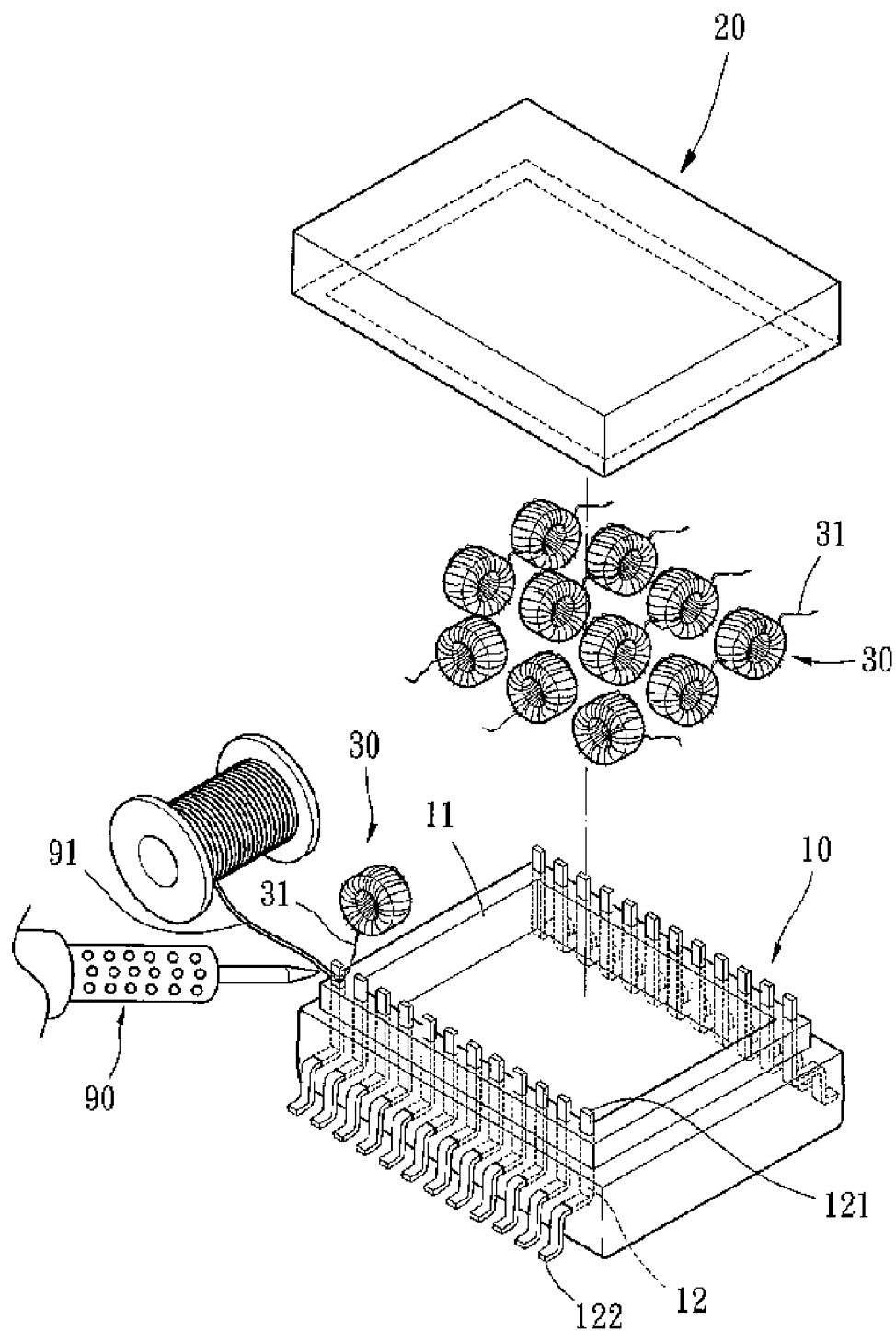
FIG. 1 is an exploded perspective view illustrating a conventional method for manufacturing an electronic device for signal transmission.
Figure 2:
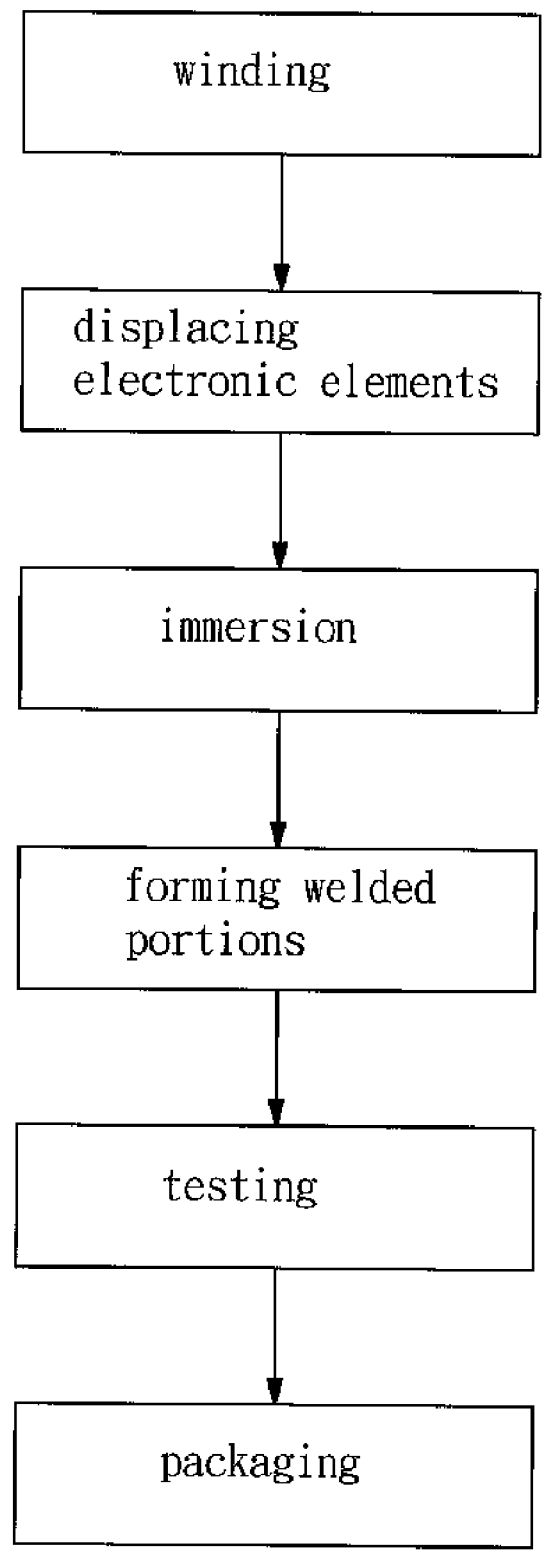
FIG. 2 is a flow chart illustrating a method for manufacturing an electronic device for signal transmission in accordance with the present invention.
Figure 3:
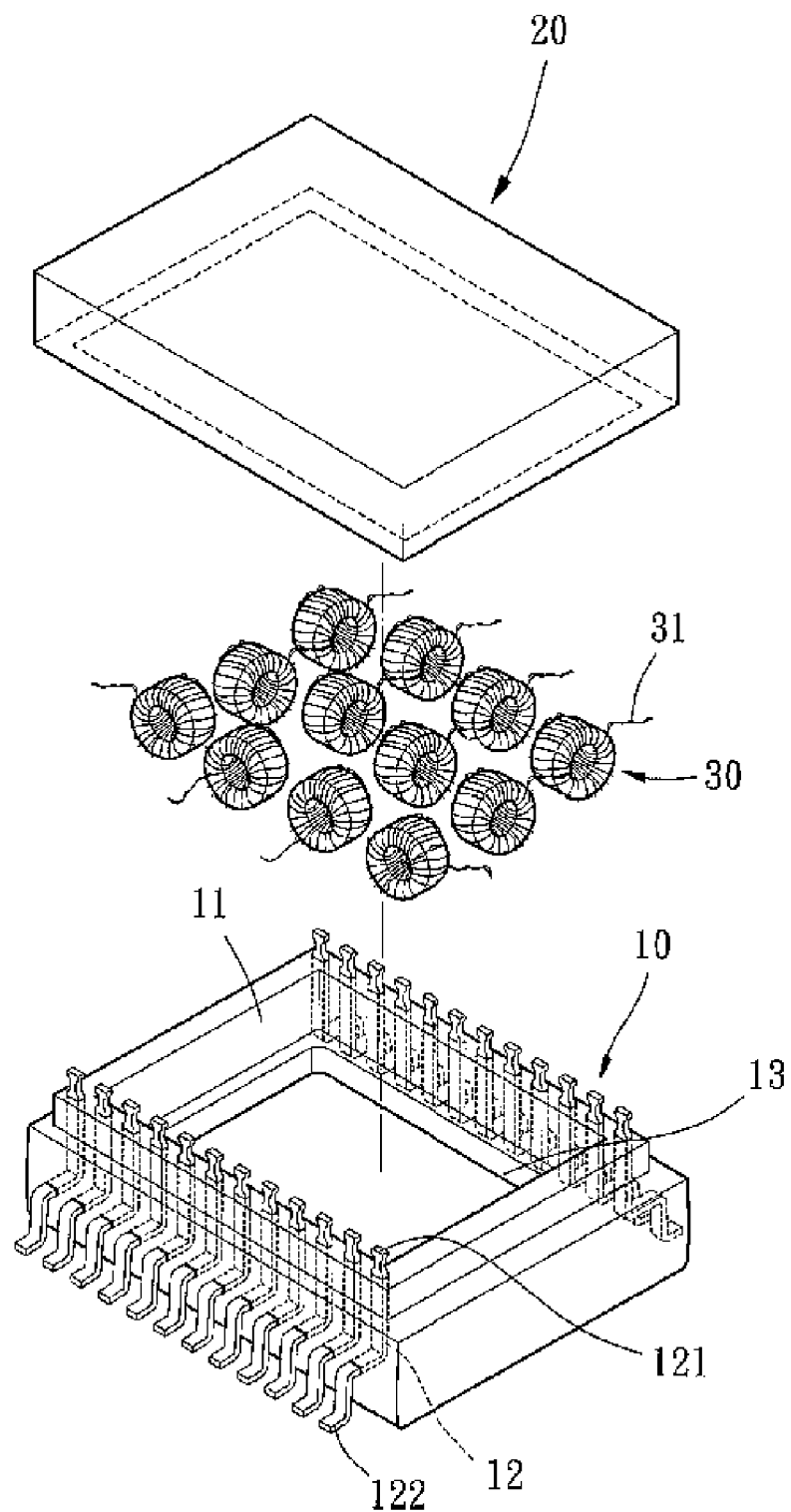
FIG. 3 is an exploded perspective view of the electronic device in accordance with the present invention.

FIG. 2 shows is a flow chart illustrating a method for manufacturing an electronic device for signal transmission in accordance with the present invention. FIG. 3 is an exploded perspective view of the electronic device in accordance with the present invention.

The electronic device comprises a packing casing 10, a packaging cover 20, and at least one electronic element 30 (several electronic elements in this embodiment). Encapsulant is applied after assembly of the packing casing 10, the packaging cover 20, and the electronic elements 30. In the illustrated embodiment, the electronic elements 30 are transformer elements each comprising an iron core wound by an enamel insulated wire. Further, each transformer element 30 comprises at least one wire 31. Nevertheless, the transformer elements 30 can be replaced by filters or other electronic elements, depending on the need of the products.

In the illustrated embodiment, the packaging casing 10 comprises a compartment 11 for accommodating the electronic elements 30. A plurality of leads 12 are embedded in each of two sidewalls of the packaging casing 10, with two ends of each lead 12 being exposed to form an inner terminal 121 and an outer terminal 122.

Figure 4:
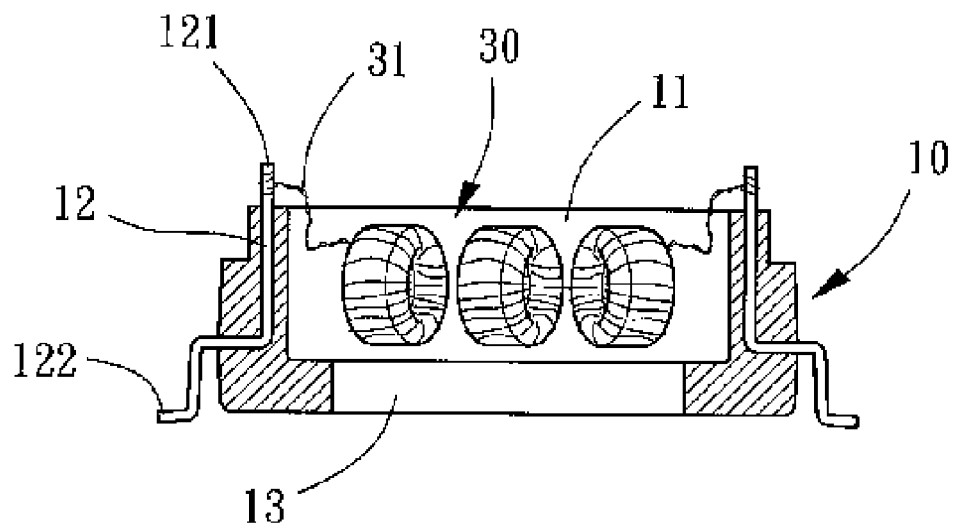
FIG. 4 is a sectional view illustrating a first step of the method for manufacturing the electronic device in accordance with the present invention.

Referring to FIGS. 2 through 4, a first step of the method for manufacturing the electronic device is winding the wires 31 of the transformer elements 30 (electronic elements) onto respective winding portions of the inner terminals 121 of the leads 12 of the packaging casing 10. The packing casing 10 includes a bottom opening 13 providing a path allowing upward/downward movement of the transformer elements 30.

Figure 5:
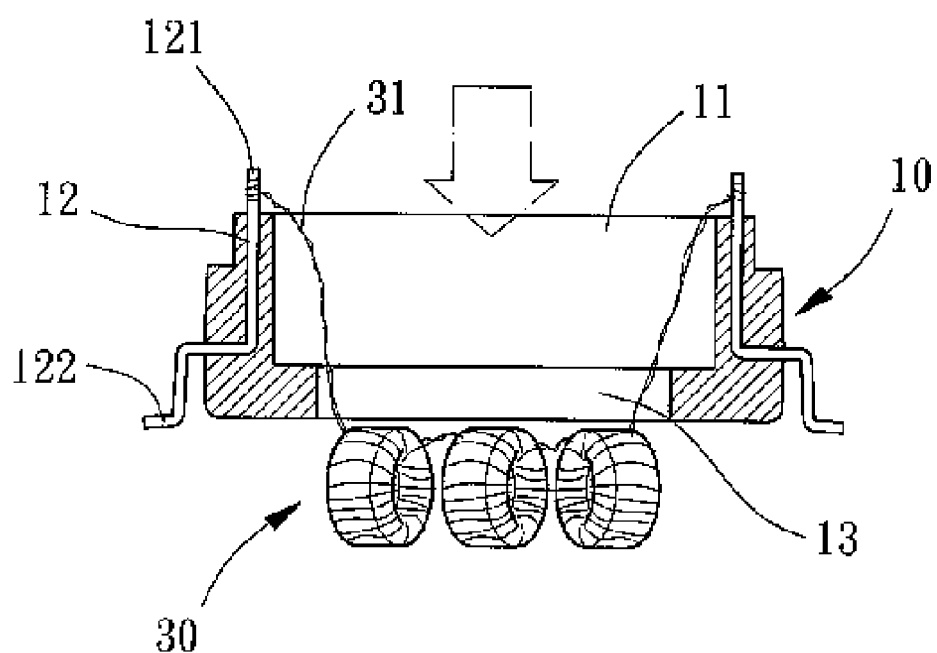
FIG. 5 is a view similar to FIG. 4, illustrating a second step of the method for manufacturing the electronic device in accordance with the present invention.

Next, as illustrated in FIGS. 2 and 5, the transformer elements 30 (electronic elements) are displaced away from the inner terminals 121 to a side of the packaging casing 10 that is distal to the inner terminal. It is noted that the transformer elements 30 are displaced by an appropriate tool while the wires 31 of the transformer elements 30 remain wound around the inner terminals 121 of the packaging casing 10.

Figure 6:
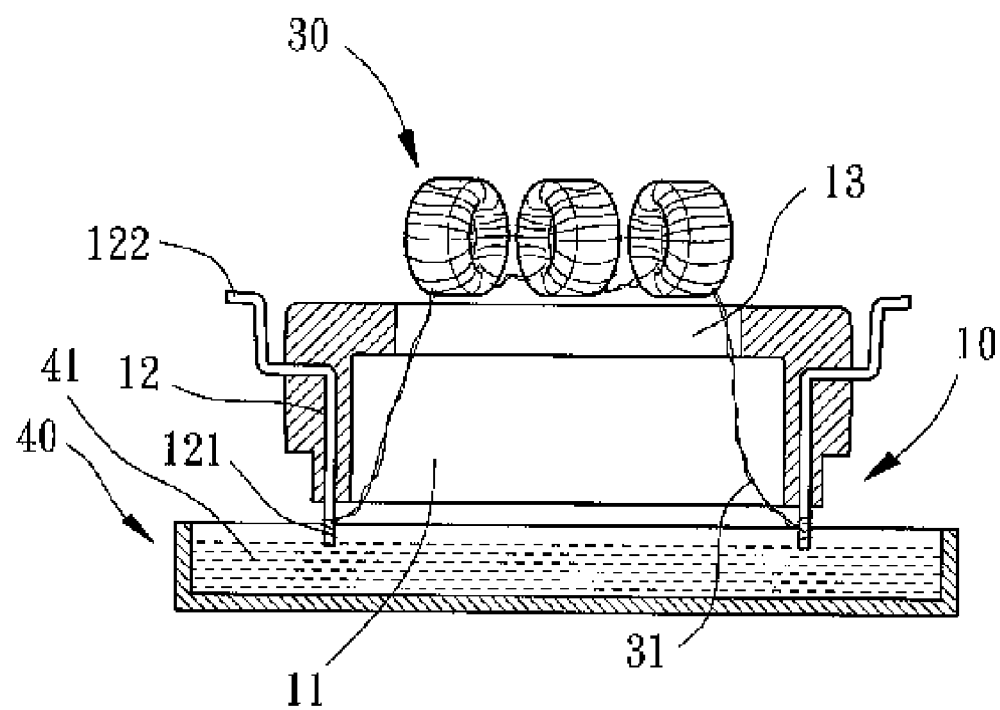
FIG. 6 is a view similar to FIG. 5, illustrating a third step of the method for manufacturing the electronic device in accordance with the present invention.

Next, as illustrated in FIGS. 2 and 6, the packaging casing 10 is placed upside down, and the winding portions of the inner terminals 121 and the wires 31 are immersed in a bath of molten solder 40 (such as soldering tin). Preferably, only the winding portions of the inner terminals 121 around which the wires 31 are wound are immersed in the bath of molten solder 40 to avoid over immersion that might lead to undesired electronic connection between two adjacent inner terminals 121. Thus, a welding procedure is simultaneously carried out on all of the winding portions of the inner terminals 121. The manufacturing process is simplified and expedited.

Figure 7:
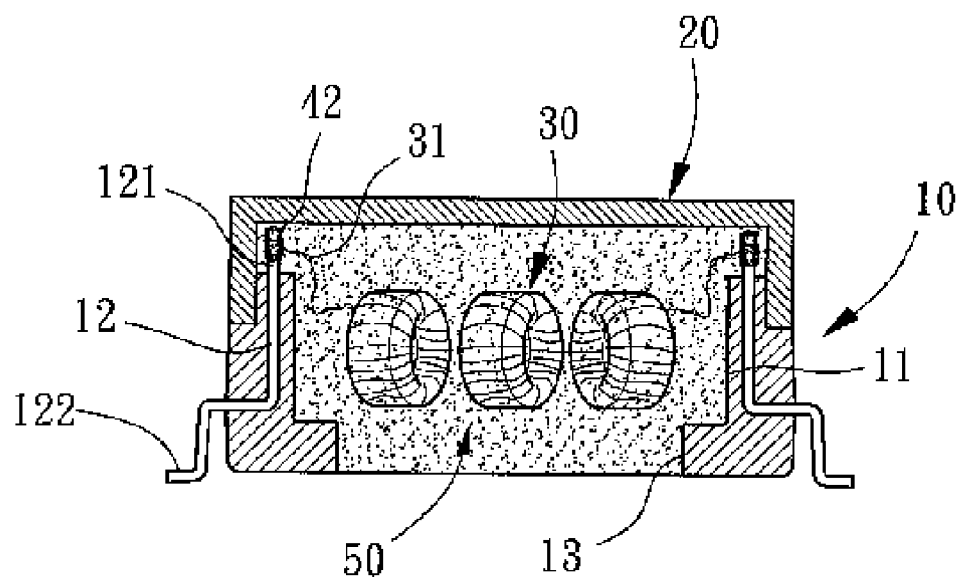
FIG. 7 is a view similar to FIG. 6, illustrating a fourth step of the method for manufacturing the electronic device in accordance with the present invention.

Next, as illustrated in FIG. 7, the inner terminals 121 and the wires 31 are removed from the bath of the molten solder 40 so that the winding portions of the inner terminals 121 form welded portions for reliably and electrically connecting the inner terminals 121 to the respective wires 31 of the electronic elements 30. More specifically, the solder stuck on the respective inner terminals 121 hardens after appropriate cooling treatment to form reliable electrical connection between the inner terminals 121 and the wires 31.

Next, still referring to FIGS. 2 and 7, the electrical connection between each inner terminal 121 and the wire 31 of the associated transformer element 30 (electronic element) is tested. Then, encapsulant 50 is securely used to embed and seal the transformer elements 30 (electronic elements) in the packaging casing 10 to obtain a product of the electronic device for signal transmission.

More specifically, a detecting device (not shown) is electrically connected to the outer terminals 122 to detect whether the welding is reliable and whether over-welding occurs. After detection, the packing cover 20 is engaged with the packaging casing 10 to cover the compartment 11 of the packaging casing 10, and encapsulant 50 (such as epoxy) is poured via the bottom opening 13 into the packaging casing 10. A product of an electronic device for signal transmission (a transformer product in this embodiment) is thus obtained.

As apparent from the foregoing, the method for manufacturing an electronic device for signal transmission in accordance with the present invention can be accomplished in a shortened period of time. Further, the method for manufacturing an electronic device for signal transmission in accordance with the present invention is simple and increases the qualified product ratio.

While the principles of this invention have been disclosed in connection with a specific embodiment, it should be understood by those skilled in the art that these descriptions are not intended to limit the scope of the invention, and that any modification and variation without departing the spirit of the invention is intended to be covered by the scope of this invention defined only by the appended claims.

What is claimed is:

1. A method for manufacturing an electronic device for signal transmission, comprising:
    winding a wire of at least one electronic element onto a winding portion of an inner terminal of a lead of a packaging casing;
    displacing said at least one electronic element away from the inner terminal to a side of the packaging casing that is distal to the inner terminal;
    immersing the winding portion of the inner terminal and the wire in a bath of molten solder;
    removing the inner terminal and the wire from the bath of the molten solder so that the winding portion of the inner terminal forms a welded portion for reliably and electrically connecting the inner terminal to the wire of said at least one electronic element; and
    testing electrical connection between the inner terminal and the wire after removing the inner terminal and the wire from the bath of the molten solder.

2. The method as claimed in claim 1, further comprising securely embedding and sealing said at least one electronic element by encapsulant after testing electrical connection between the inner terminal and the wire.

3. The method as claimed in claim 1, with the electronic element being one of a transformer element and a filter.

4. The method as claimed in claim 1, with the packaging casing comprising a compartment for accommodating said at least one electronic element.

5. The method as claimed in claim 4, further comprising covering the compartment with a packaging cover.

6. The method as claimed in claim 1, with the packaging casing further comprising a bottom opening allowing passage of said at least one electronic element.

7. The method as claimed in claim 1, with said at least one lead being embedded in a sidewall of the packaging casing, with said at least one lead comprising two exposed ends respectively forming said inner terminal and an outer terminal.

8. The method as claimed in claim 1, with the solder being soldering tin.

* * * * *